(12) United States Patent
Bindana et al.

(10) Patent No.: US 12,373,001 B2
(45) Date of Patent: Jul. 29, 2025

(54) METHODS AND SYSTEMS FOR SECURING A USER INTERFACE PANEL OF A MULTI-FUNCTION DEVICE

(71) Applicant: XEROX CORPORATION, Norwalk, CT (US)

(72) Inventors: Srinivasarao Bindana, Kakinada (IN); Prasanth Kalaiselvan, Mayiladu (IN)

(73) Assignee: Xerox Corporation, Norwalk, CT (US)

( * ) Notice: Subject to any disclaimer, the term of this patent is extended or adjusted under 35 U.S.C. 154(b) by 655 days.

(21) Appl. No.: 17/672,938

(22) Filed: Feb. 16, 2022

(65) Prior Publication Data

US 2023/0259161 A1 Aug. 17, 2023

(51) Int. Cl.
| | |
|---|---|
| *G06F 1/16* | (2006.01) |
| *G06F 3/12* | (2006.01) |
| *H05K 5/00* | (2025.01) |
| *H05K 7/00* | (2006.01) |
| *H05K 7/14* | (2006.01) |

(52) U.S. Cl.
CPC .......... *G06F 1/1622* (2013.01); *G06F 1/1624* (2013.01); *G06F 1/1696* (2013.01); *G06F 3/1279* (2013.01); *H05K 7/1481* (2013.01)

(58) Field of Classification Search
CPC .... G06F 1/1622; G06F 1/1624; G06F 1/1696; G06F 3/1279; H05K 7/1481
See application file for complete search history.

(56) References Cited

U.S. PATENT DOCUMENTS

| | | | | |
|---|---|---|---|---|
| 9,449,450 | B1* | 9/2016 | Kucer | G07G 1/0018 |
| 11,394,835 | B1* | 7/2022 | Bindana | H04N 1/126 |
| 2017/0180578 | A1* | 6/2017 | Nimura | H04N 1/00687 |
| 2020/0090462 | A1* | 3/2020 | Tillery | A63F 13/90 |
| 2023/0021732 | A1* | 1/2023 | Radcliffe | F16M 11/10 |
| 2023/0359238 | A1* | 11/2023 | Batten | G06F 1/1601 |

* cited by examiner

*Primary Examiner* — Anthony M Haughton
(74) *Attorney, Agent, or Firm* — Fox Rothschild LLP

(57) ABSTRACT

The present disclosure discloses a method and a system for securing a user interface (UI) panel of a multi-function device. The method includes activating a retraction assembly, based on one or more retraction triggering conditions. Once the retraction assembly is activated, multiple components of the retraction assembly start functioning. At first, the UI panel is moved to a first position. Next, the UI panel is moved from the first position to a second position. Then, the UI panel in the second position is retracted into the multi-function device to secure the UI panel inside the multi-function device. This way, the UI panel is secured inside the multi-function device. Later, the retracted UI panel may be moved out of the multi-function device. To move the UI panel outside the multi-function device, the retraction assembly is activated again based on the one or more protraction triggering conditions.

28 Claims, 13 Drawing Sheets

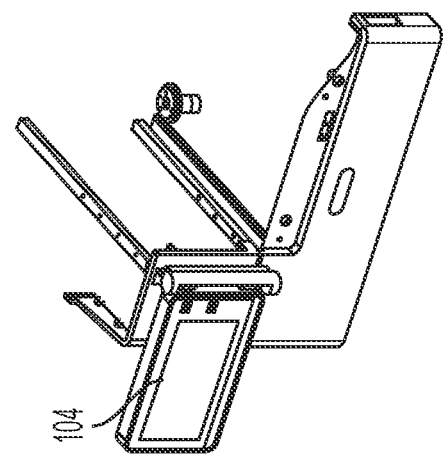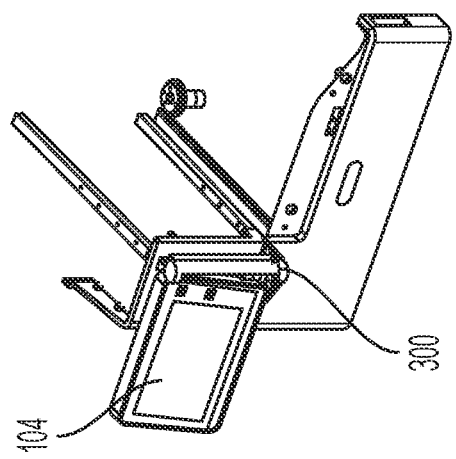
FIG. 3A

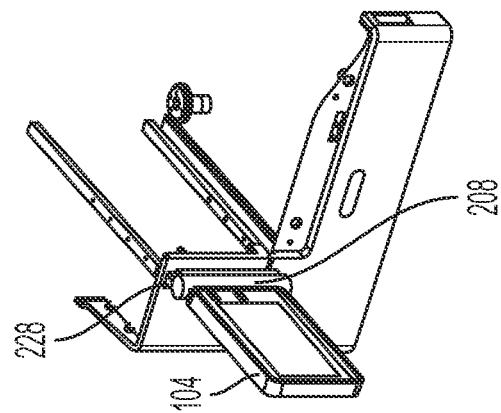
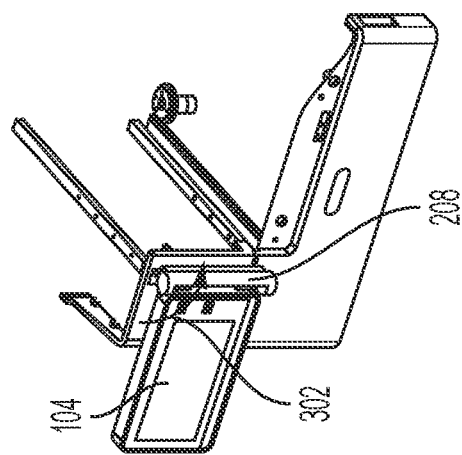
FIG. 3B

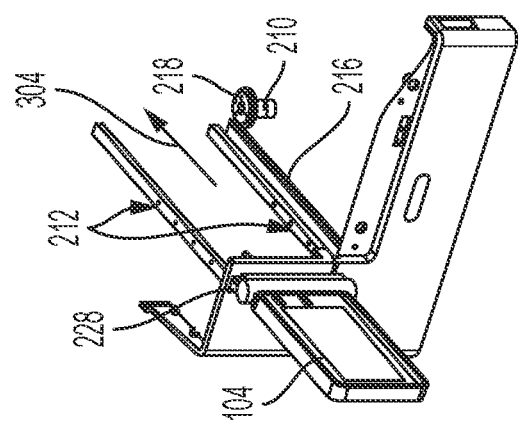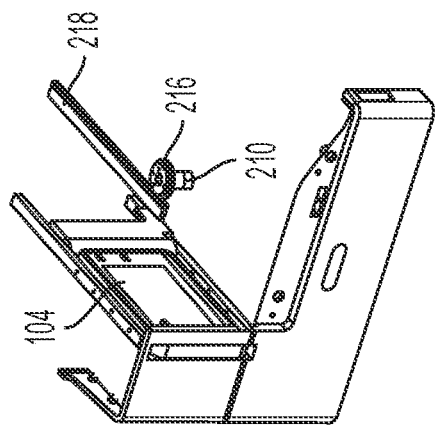
FIG. 3C

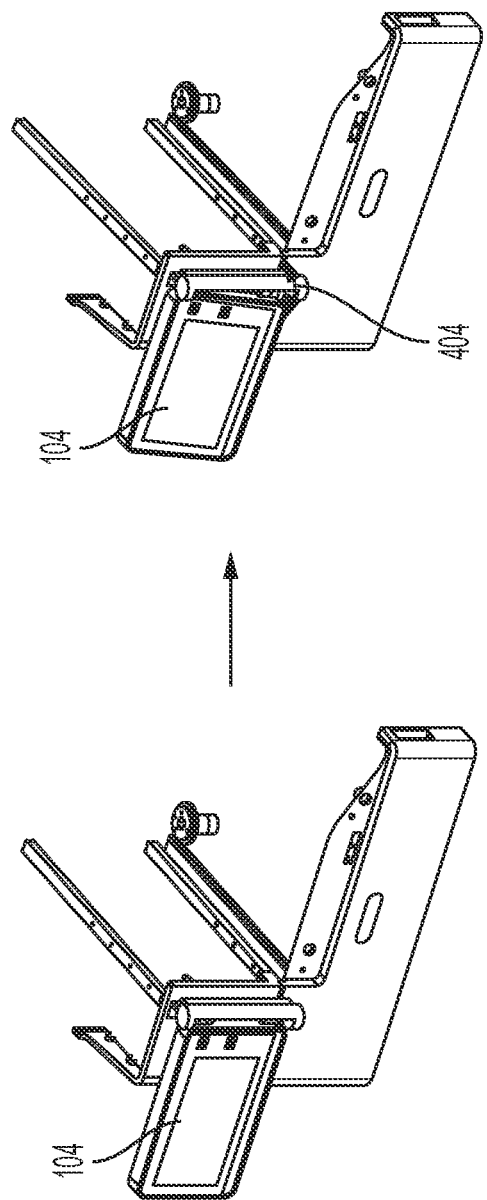

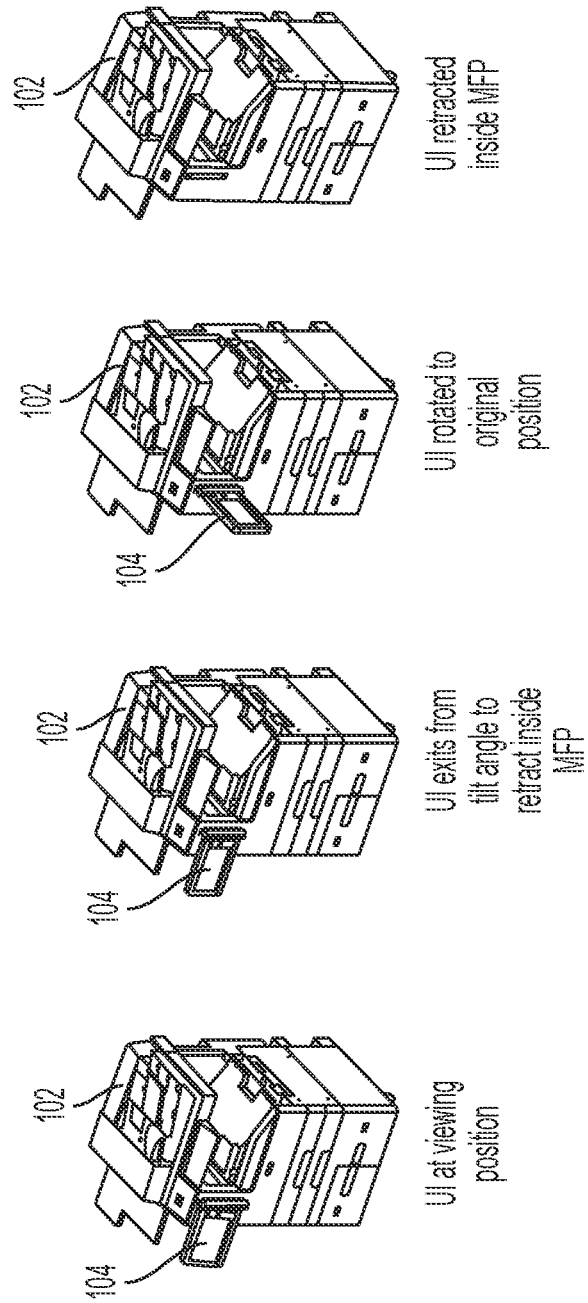

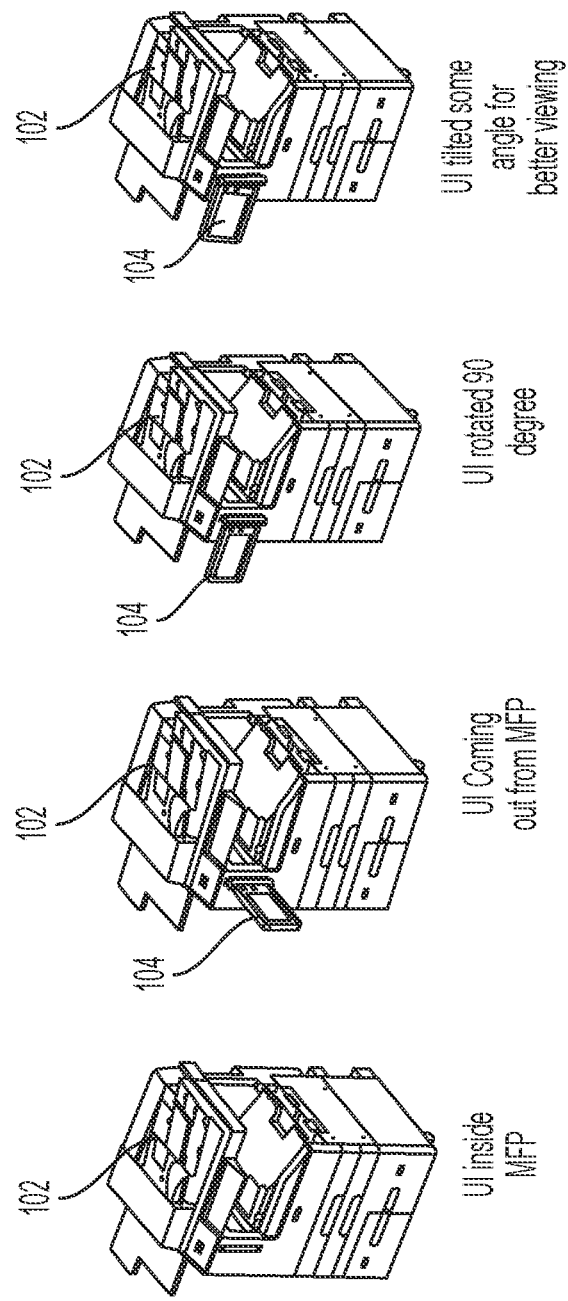

METHODS AND SYSTEMS FOR SECURING A USER INTERFACE PANEL OF A MULTI-FUNCTION DEVICE

TECHNICAL FIELD

The present disclosure relates to user interface panels, and more particularly, to methods and systems for securing a user interface panel of a multi-function device.

BACKGROUND

Commonly seen multi-function devices include a user interface (UI) panel for easy access and performing operations such as printing, scanning, copying, imaging, or the like, at the multi-function devices. The UI panel allows a user to provide one or more inputs as well as display various messages to the user. For example, the UI panel may be a touch panel that allows the user to provide inputs such as scan parameters, print parameters, or the like. In another example, the UI panel displays various messages to the user related to print, scan, or other functionalities being performed at the multi-function device. For instance, the message can be "your print is completed, please collect printed documents". Another message can be "please place your documents appropriately at platen for scanning".

Generally, the UI panel is located outside of the multi-function device such that it is easily accessible for use by users. Since the UI panel is located outside of the multi-function device, the UI panel is susceptible to damages specifically, when not in use. For example, during shifting of the multi-function device from one place to another in an office environment, the UI panel may collide with a neighbor object or wall. Due to such collisions, the UI panel gets damaged, which leads to repair cost or replacement of the UI panel. In another example, a passerby carrying a coffee near the multi-function device may accidentally spill the coffee over the UI panel and damage the UI panel. Therefore, there is a need for a method and a system to secure the UI panel.

SUMMARY

According to aspects illustrated herein, a multi-function device is disclosed. The multi-function device includes a user interface (UI) panel for allowing one or more users to provide one or more inputs and display one or more messages to the one or more users, wherein the UI panel is tilted. The multi-function device further includes a controller for managing a retraction assembly associated with the multi-function device, based on one or more triggering conditions. The multi-function device furthermore includes the retraction assembly communicatively coupled to the controller. The retraction assembly, upon activation, retracts the UI panel into the multi-function device to secure the UI panel inside the multi-function device.

According to further aspects illustrated herein, a method for securing a user interface (UI) panel of a multi-function device is disclosed. The method includes activating a retraction assembly, based on one or more triggering conditions. The method further includes, based on the activation, performing at least: retracting the UI panel into the multi-function device to secure the UI panel inside the multi-function device, and moving the retracted UI panel outside the multi-function device for use by one or more users.

According to furthermore aspects illustrated herein, a retraction assembly associated with a multi-function device for securing a user interface (UI) panel of the multi-function device is disclosed. The retraction assembly includes a first actuator for moving the UI panel to a first position, a second actuator for moving the UI panel from the first position to a second position, and a third actuator for retracting the UI panel, in the second position, into the multi-function device to secure the UI panel inside the multi-function device.

Other and further aspects and features of the disclosure will be evident from reading the following detailed description of the embodiments, which are intended to illustrate, not limit, the present disclosure.

BRIEF DESCRIPTION OF THE DRAWINGS

The illustrated embodiments of the subject matter will be best understood by reference to the drawings, wherein like parts are designated by like numerals throughout. The following description is intended only by way of example, and simply illustrates certain selected embodiments of devices, systems, and processes that are consistent with the subject matter as claimed herein.

FIGS. 3A-3C show different snapshots of the retraction assembly collectively depicting retraction of the UI panel, according to an embodiment of the present disclosure.

FIGS. 4A-4C show different snapshots of the retraction assembly collectively depicting protraction of the UI panel, according to an embodiment of the present disclosure.

FIGS. 5A-5D show different positions of the UI panel during the retraction of the UI panel, according to an embodiment of the present disclosure.

FIGS. 6A-6D show different positions of the UI panel during the protraction of the UI panel, according to an embodiment of the present disclosure.

DESCRIPTION

Figure 1:
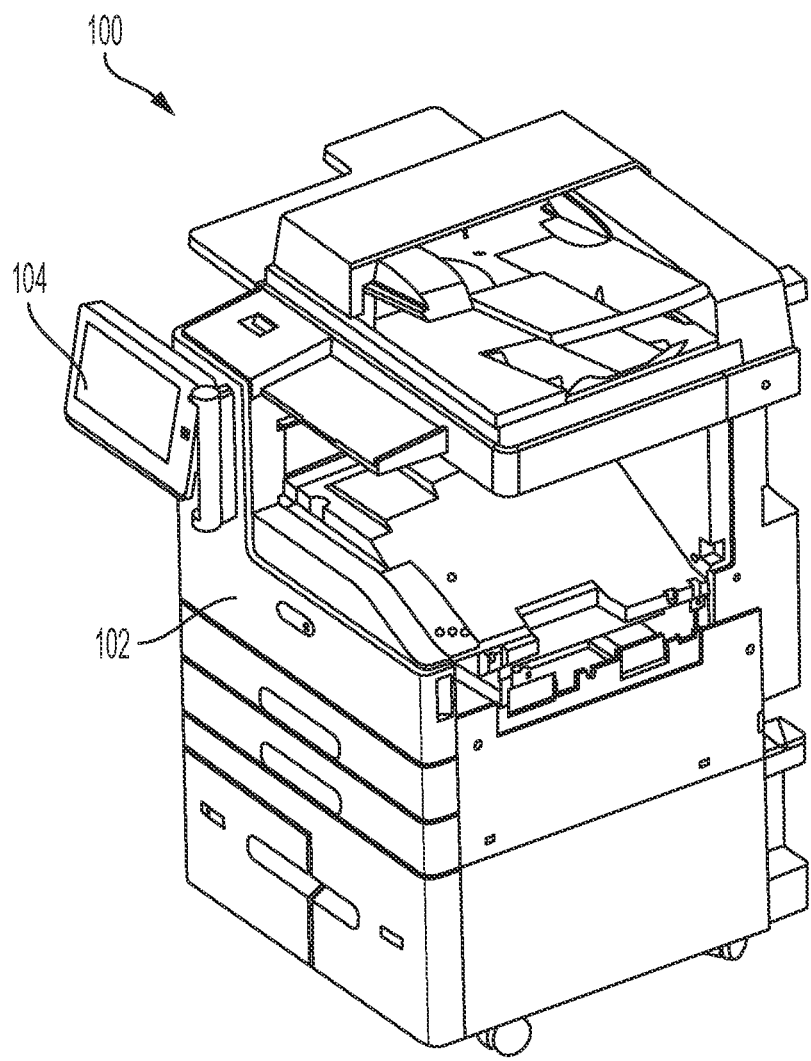
FIG. 1 refers to an exemplary environment in which various embodiments of the disclosure can be practiced.

The following detailed description is made with reference to the figures. Some of the embodiments are described to illustrate the disclosure, not to limit its scope, which is defined by the claims. Those of ordinary skill in the art will recognize a number of equivalent variations in the description that follows.

Non-Limiting Definitions

Definitions of one or more terms that will be used in this disclosure are described below without limitations. For a person skilled in the art, it is understood that the definitions are provided just for the sake of clarity and are intended to include more examples than just provided below. In various embodiments of the present disclosure, definitions of one or more terms that will be used in the document are provided below.

The term "multi-function device" refers to a single device or a combination of multiple devices configured to perform one or more functions such as, but not limited to, scanning, printing, copying, imaging, or the like. The multi-function device includes software, hardware, firmware, or a combination thereof. In context of the current disclosure, the multi-function device manages a user interface (UI) panel of a multi-function device based on one or more triggering conditions. For example, the multi-function device retracts a UI panel based on the one more one or more triggering conditions. In another example, the multi-function device moves the retracted UI panel outside the multi-function device, based on the one or more triggering conditions. Few non-limiting examples of the triggering conditions include at least: when the multi-function device is not in use, when the multi-function device is turned off, when the UI panel is not in use, when no user is present in proximity to the multi-function device, when the multi-function device is moved from one location to other location, when a request to retract the UI panel is received from a user or from an admin user, when the multi-function device is turned on, when a user wants to use the multi-function device or the UI panel of the multi-function device, or when a user is present in proximity to the multi-function device. Some triggering conditions may be applicable to the retraction scenario while some may be applicable to protraction scenario where the UI panel is to be moved outside the multi-function device. To this end, the multi-function device includes a retraction assembly to retract the UI panel inside the multi-function device and/or move the retracted UI panel outside the multi-function device.

The term "user interface (UI) panel" refers to a device associated with the multi-function device that users use to interact with the multi-function device and further perform and control operations at the multi-function device. The UI panel can be a graphical user interface, a touch user interface, a form-based user interface, a menu-driven user interface, and a voice-based user interface or a combination thereof. The UI panel can be used by the users to provide various inputs and/or display various messages to the users. In context of the current disclosure, the UI panel is retracted inside with the multi-function device or moved outside the multi-function based on requirements or triggering conditions.

The term "user" refers to any user who wishes to use the multi-function device for printing one or more documents or may wish to scan a document or perform any operation at the multi-function device.

The term "retraction assembly" refers to an assembly that includes one or more components such as actuators and guide rails, and each component works in tandem with each other to retract the UI panel into the multi-function device to secure the UI panel inside the multi-function device. The retraction assembly also move the retracted UI panel out of the multi-function device.

The term "retraction" refers to taking back the UI panel of the multi-function device inside the multi-function device such that the UI panel is secured.

The term "protraction" refers to moving the retracted UI panel outside the multi-function device.

The term "secure" refers to protecting the UI panel from any kind of damage, breakouts, knowingly or unknowingly by users.

The term "admin user" refers to a user who manage multi-function device and has admin rights to do any necessary configuration at the multi-function device.

The term "tilted position" refers to a position when the UI panel is available for use by users and is set at a tilt angle such as 35-50 degree with respect to horizontal surface of the multi-function device.

The term "first position" refers to a normal position or a non-tilted position of the UI panel, e.g., the UI panel with zero tilt angle.

The term "second position" refers to a position where the UI panel is aligned with an opening of the multi-function device such that the UI panel can be retracted into the multi-function device via the opening of the multi-function device.

The term "retracted position" refers to a position where the UI panel is taken back inside the multi-function device completely and is not available for use by users.

Overview

The present disclosure proposes a mechanism, a system and a method to retract a UI panel of a device inside the device. Various examples of the devices can be printers, scanners, multi-function devices, multi-function peripheral devices, or the like. Specifically, the disclosure provides an assembly such as a retraction assembly, for retracting the UI panel inside the device such as a multi-function device. The assembly includes one or more components to move the UI panel through different positions to retract the UI panel. The UI panel is retracted for safe storage and to prevent damage. Similarly, the assembly moves the retracted UI panel outside the multi-function device.

In addition, the retraction mechanism can be considered as a security feature to protect the device from theft or damage when the device is not in use. The disclosure further enhances user experience when interacting with such devices and offers design improvement.

Exemplary Environment

FIG. 1 refers to an exemplary environment 100 in which various embodiments of the disclosure can be practiced. The environment 100 is shown to include a multi-function device 102. The multi-function device 102 is a device that performs one or more functions such as, but not limited to, scanning, printing, copying, imaging, faxing, form filling, and so forth. The environment 100 is shown to include the multi-function device 102, but the environment 100 may include a scanner, a printer, a copier, multi-function peripheral device, a multi-function printer, or any device with a user interface (UI) such as UI panel 104.

As further shown, the multi-function device 102 includes the user interface (UI) panel 104. The UI panel 104 is a device that allows a user to perform one or more activities at the multi-function device 102 and control operations of the multi-function device 102. The UI panel 104 can be used to provide inputs related to various functionalities at the multi-function device 102 such as printing, scanning, copying, imaging, or the like. For example, the user can select or input scan parameters such as double side, color scan, scan output, etc., print parameters such as print color, single side/double side, etc. The UI panel 104 can be used to display one or more messages or alerts to the user. For example, the message may be related to print activity or scan activity. The UI panel 104 includes one or a combination of a graphical user interface, a touch user interface, a form-based user interface, a menu-driven user interface, and a voice-based user interface. For example, the UI panel 104 may include a touch panel that displays one or more options, such as a print option, a copy option, or a scan option, selectable by the user. The user may select the print option to print a document, the copy option to copy a document, or the scan option to scan a document.

In context of the present disclosure, the multi-function device 102 includes a retraction assembly for securing the UI panel 104 of the multi-function device 102. The retraction assembly is activated, based on one or more retraction triggering conditions. The retraction triggering conditions refer to triggering conditions when the UI panel 104 is to be moved inside the multi-function device 102 and these can be referred to as triggering conditions without limiting its scope. The UI panel 104 can be retracted inside the multi-function device 102 when not in use by any user. The UI panel 104 can be retracted inside the multi-function device 102 when no user is found near/around the multi-function device 102. The UI panel 104 can be retracted inside the multi-function device 102 when the multi-function device 102 is moved from one location to another location. These are few examples of the triggering conditions, but other examples can also be considered. The UI panel 104 can be retracted automatically by the multi-function device 102, or the UI panel 104 can be retracted based on an input or request from the user or an admin user. For example, if the user does not require UI panel 104, the user can provide his input for retraction and the multi-function device 102 activates the retraction assembly. Based on the activation, the retraction assembly retracts the UI panel 104 into the multi-function device 102 to secure the UI panel 104 inside the multi-function device 102. More details on how the UI panel 104 is retracted will be discussed below in conjunction with FIGS. 2A and 2B.

Similarly, the retraction assembly moves out the retracted UI panel 104 outside the multi-function device 102 based on one or more protraction triggering conditions. The protraction triggering conditions refer to triggering conditions when the UI panel 104 is to be moved outside the multi-function device 102 and these can be referred to as triggering conditions without limiting its scope. For example, if the UI panel 104 is retracted inside the multi-function device 102, and the multi-function device 102 finds the user near the multi-function device 102, the retracted UI panel 104 is automatically moved out from the multi-function device 102. In another example, the retracted UI panel 104 is moved outside the multi-function device 102 after a pre-defined time. These are few examples but there can be other scenarios when the retracted UI panel 104 can be moved outside the multi-function device 102. More details on the retraction assembly, its components and its functioning will be discussed in detail below.

Exemplary System

Figure 2A:
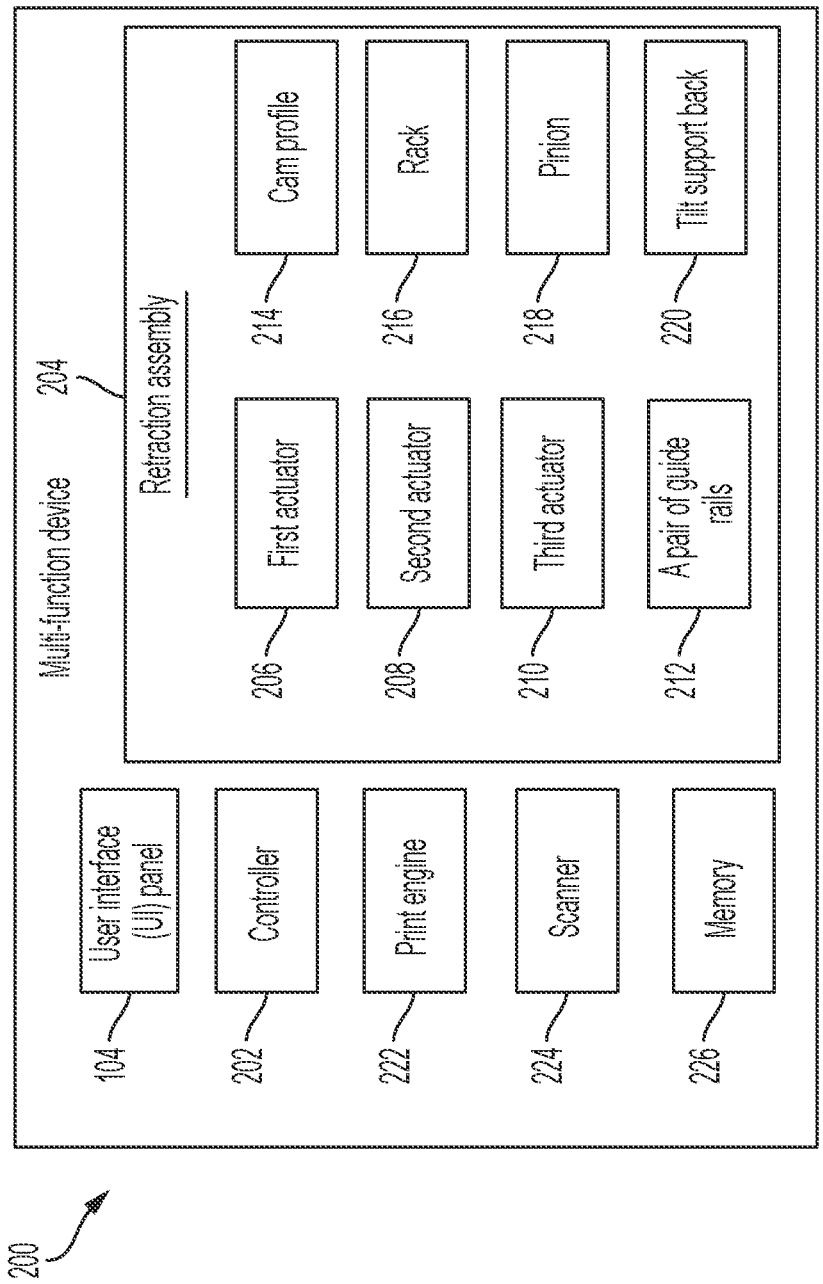
FIG. 2A is a block diagram of a system for securing a user interface (UI) panel of a multi-function device, according to an embodiment of the present disclosure.

FIG. 2A shows a block diagram of a system 200 for securing the UI panel 104. The system 200 is shown to include a multi-function device such as multi-function device 102 including the UI panel 104, a controller 202, a retraction assembly 204, a print engine 222, a scanner 224, and a memory 226. The retraction assembly 204 includes a first actuator 206, a second actuator 208, a third actuator 210, a pair of guide rails 212, a cam profile 214, a rack 216, a pinion 218, and a tilt support back 220. The components 104, 202-230 are connected to each other via a conventional bus or a later developed protocol. The components 104 and 202-230 communicate with each other for performing various functions of the present disclosure. The system 200 may further include additional component(s) as required to implement the present disclosure.

The controller 202 may be implemented as a combination of hardware and software. The "hardware' may include a combination of discrete components, an integrated circuit, an application-specific integrated circuit (ASIC), a field programmable gate array (FPGA), a processor, or other suitable hardware. The "software" may include one or more objects, agents, threads, lines of code, subroutines, separate software applications, two or more lines of code, or other suitable software structures executable by the processor. In some implementations, the controller 202 may be implemented by computer executable program instructions.

The controller 202 manages one or more functions at the multi-function device 102 related to at least printing scanning, copying, imaging, form filling, or the like. In context of the current disclosure, the controller 202 manages the retraction assembly 204 associated with the multi-function device 102, based on one or more triggering conditions.

As shown, the UI panel 104 allows the user to perform one or more activities at the multi-function device 102 and control operations of the multi-function device 102. The UI panel 104 receives inputs from the user related to various functionalities at the multi-function device 102 such as printing, scanning, copying, imaging, or the like. Further, the UI panel 104 displays various messages to the user related to print, scan, or other functionalities being performed at the multi-function device 102.

The memory 226 stores various details such as print settings, scan settings, pre-defined messages, documents of the user, and other details. Additionally, the memory 226 stores details relevant for the present disclosure such as triggering conditions for the retraction, triggering conditions for the protraction, a tilt angle of the UI panel 104 or the like.

Typically, the user uses multi-function device 102 for various purposes. For example, the user submits a document for printing from his computing device or directly selects print from the memory 226 for printing. The multi-function device 102 receives the print request and the print engine 222 of the multi-function device 102 prints the document of the user according to print attributes. On the similar lines, scanning activity is performed at the multi-function device 102. For example, the user submits a document for scanning at the multi-function device 102. The scanner 224 scans the document according to the scan parameters and generates a scan output. Finally, the controller 202 sends the scanned output to the user via email, USB, cloud location, or other desired destinations. While performing any activity at the multi-function device 102, the user uses the UI panel 104 for various purposes as discussed above.

The controller 202 determines occurrence of at least one triggering condition and activates the retraction assembly 204. Various examples of the triggering conditions may include: when the multi-function device 102 is not in use, when the multi-function device 102 is turned off, when the UI panel 104 is not in use, when no user is found near/around the multi-function device 102, when a request to retract the UI panel 104 is received from the user or from an admin user. For example, the controller 202 monitors ON/OFF state of the multi-function device 102 to determine whether the multi-function device 102 is turned on or turned off. When the multi-function device 102 is turned off, the controller 202 determines that the multi-function device 102 is turned into OFF state and, subsequently, activates the retraction assembly 204. In another example, a retraction option is provided on the UI panel 104. When the user selects the retraction option, the controller 202 activates the retraction assembly 204. Here, the selection of the retraction option by the user can be considered as a retraction triggering condition.

In further examples, the controller 202 determines if user is present near the multi-function device 102, and if it is determined that the user is not present near the multi-function device 102, then the controller 202 activates the retraction assembly 204. The user presence near the multi-function device 102 can be determined using a detector (not shown). The detector may be a camera, a motion sensor, or the like. For instance, a human detection camera is installed on the multi-function device 102. The human detection camera is installed at a location on the multi-function device 102 such that the human detection camera captures images of human movements in proximity to the multi-function device 102. The controller 202 processes the images captured by the human detection camera to detect the presence of the user in proximity to the multi-function device 102. If it is determined that the user is not in proximity to the multi-function device 102, then the controller 202 activates the retraction assembly 204.

Based on the activation of the retraction assembly 204, the retraction assembly 204 retracts the UI panel 104 into the multi-function device 102 to secure the UI panel 104 inside the multi-function device 102. The retraction assembly 204 includes multiple components that work together to retract the UI panel 104 into the multi-function device 102 to secure the UI panel 104. The UI panel 104 is in a titled position/a viewing position, i.e., a position in which the user typically uses the UI panel 104 for various purposes. For example, at first, the UI panel 104 is moved to a first position by the first actuator 206. Next, the UI panel 104 is moved from the first position to a second position by the second actuator 208. Then, the UI panel 104 in the second position is retracted into the multi-function device 102 to secure the UI panel 104 inside the multi-function device 102.

Figure 2B:
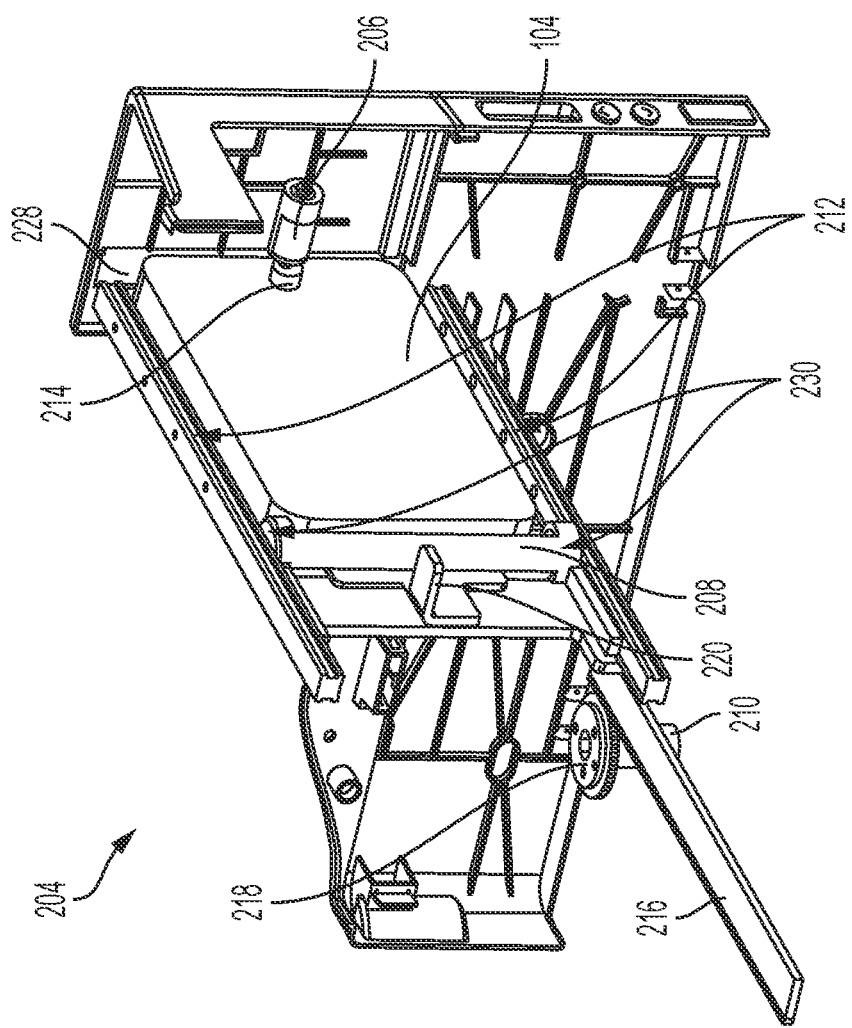
FIG. 2B shows a perspective view of a retraction assembly depicting multiple components of the retraction assembly, according to an embodiment of the present disclosure.

A perspective view of the retraction assembly 204 depicting the multiple components of the retraction assembly 204 is shown in FIG. 2B. The retraction assembly 204 includes the first actuator 206, the second actuator 208, the third actuator 210, the pair of guide rails 212, the cam profile 214, the rack 216, the pinion 218, the tilt support back 220, and an opening 228. The retraction assembly 204 further includes a ball joint 230 with a linear adjustment mechanism which tilts the UI panel 104 to a certain angle. The first actuator 206 may be a rotary solenoid that produces rotary motion. The first actuator 206 may be an electric motor such as a direct current (DC) motor or a stepper motor. The first actuator 206 is attached to the cam profile 214.

The second actuator 208 may be a rotary solenoid or an electric motor that produces rotary motion. The third actuator 210 may be a rotary solenoid or an electric motor that produces rotary motion. The rack 216 is a linear gear and the pinion 218 is a circular gear. The rack 216 and the pinion 218 together form a rack and pinion mechanism. The rack and pinion mechanism are attached to the third actuator 210. The rack 216 and the pinion 218 translate the rotational motion produced by the third actuator 210 into a linear motion. Actuators of the present disclosure, such as the first actuator 206, the second actuator 208, and the third actuator 210, correspond to any mechanism that causes or enables a desired motion of a part, whether manual or motorized. Alternatively, the actuators of the present disclosure can be a combination of a mechanism (or a mechanical device) and electric motor, which causes or enables desired motions of a part, whether manual or motorized.

The aforementioned parts of the retraction assembly 204 work together to retract the UI panel 104 into the multi-function device 102 to secure the UI panel 104, as described below with reference to FIGS. 3A-3C.

FIGS. 3A-3C show different snapshots of the retraction assembly 204 in function to secure the UI panel 104. Initially, the UI panel 104 is in a tilted position, i.e., the UI panel 104 is at a tilt angle (marked via arrow 300) as opposed to substantially vertical or substantially horizontal. When the retraction assembly 204 is activated by the controller 202, based on the one or more retraction triggering conditions, the first actuator 206 moves the UI panel 104 from the tilted position to a first position, as shown in FIG. 3A. The first position refers to a normal position or a non-tilted position of the UI panel 104, e.g., the UI panel 104 with zero tilt angle with respect to a horizontal surface of the multifunction device 102. Alternatively, the UI panel 104 can be moved to the first position manually by the user. For instance, the user may exert a force against the UI panel 104 to move the UI panel 104 to the first position.

Further, the UI panel 104 in the first position is moved to a second position by the second actuator 208. For instance, the second actuator 208 rotates the UI panel 104 in a direction 302 to move the UI panel 104 from the first position to the second position, as shown in FIG. 3B. The second position refers to a position where the UI panel 104 is aligned with the opening 228 such that the UI panel 104 can be retracted into the multi-function device 102 via the opening 228. The second actuator 208 moves the UI panel 104 from the first position to the second position by moving the UI panel 104 by 90 degree in the direction 302.

The third actuator 210 retracts the UI panel 104, in the second position, into/inside the multi-function device 102 to secure the UI panel 104. For instance, the third actuator 210 rotates in clockwise direction. The pinion 218 and the rack 216 translate the clockwise rotation into a linear motion in a direction 304, because of which the UI panel 104 is retracted into the multi-function device 102, via the opening 228, as shown in FIG. 3C. The pair of guide rails 212 guide a movement of the UI panel 104 while retracting the UI panel 104 into the multi-function device 102. In such a manner, the UI panel 104 is retracted into the multi-function device 102 to secure the UI panel 104 inside the multi-function device 102. This way, the UI panel 104 is retracted inside the multi-function device 102 using the retraction assembly 204. Here the UI panel 104 is in the retracted position i.e., a position where the UI panel 104 rests inside the multi-function device 102.

Like the retraction of the UI panel 104, the retraction assembly 204 can perform protraction of the retracted UI panel 104, i.e., move the retracted UI panel 104 out of the multi-function device 102. The controller 202 activates the retraction assembly 204, based on one or more protraction triggering conditions, to move the retracted UI panel 104 out of the multi-function device 102. For example, the controller 202 activates the retraction assembly 204 when the multi-function device 102 is turned on. In another example, the controller 202 activates the retraction assembly 204 when the user comes in proximity of the multi-function device 102. The human detection camera is used to determine if the user is present in proximity to the multi-function device 102. The human detection camera captures images of human movements in proximity to the multi-function device 102. The controller 202 processes the images captured by the human detection camera to detect the presence of the user in proximity to the multi-function device 102. If it is determined that the user is in proximity to the multi-function device 102, then the controller 202 activates the retraction assembly 204.

When the retraction assembly 204 is activated based on the one or more protraction triggering conditions, the retraction assembly 204 moves the retracted UI panel 104 out of the multi-function device 102. The multiple components of the retraction assembly 204 work together to move the retracted UI panel 104 out of the multi-function device 102, as described below with reference to FIGS. 4A-4C.

Figure 4A:
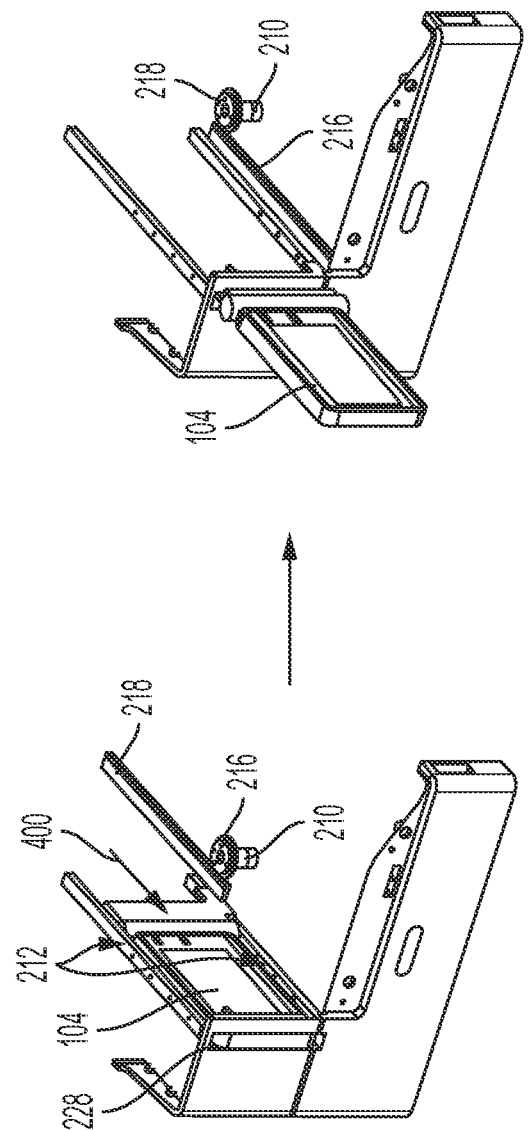
Figure 4B:
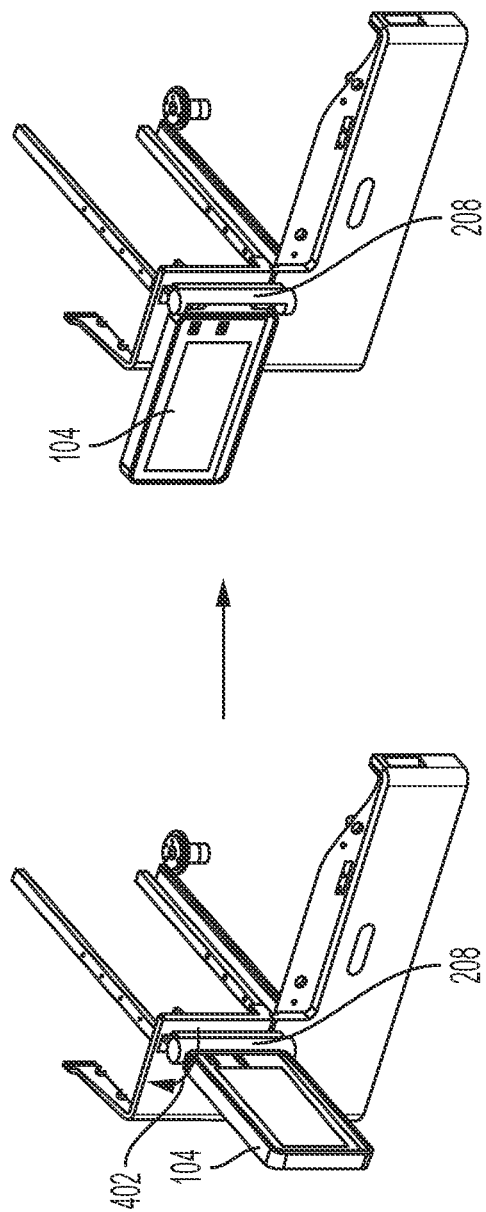

FIGS. 4A-4C show different snapshots of the retraction assembly 204 in function to move the retracted UI panel 104 out of the multi-function device 102. Here, an actuator such as the third actuator 210 moves the retracted UI panel 104 to the second position. For instance, the third actuator 210 rotates in anticlockwise direction. The pinion 218 and the rack 216 translate the anticlockwise rotation into a linear motion in a direction 400, because of which the retracted UI panel 104 is moved to the second position, via the opening 228, as shown in FIG. 4A. The pair of guide rails 212 guide a movement of the retracted UI panel 104 while moving the retracted UI panel 104 to the second position.

Further, the UI panel 104 in the second position is moved to the first position by the second actuator 208. For instance, the second actuator 208 rotates the UI panel 104 in a direction 402 by 90 degree to move the UI panel 104 from the second position to the first position, as shown in FIG. 4B. When the UI panel 104 is in the first position, the tilt support back 220 is situated at top of the cam profile 214. The tilt support back 220 situated on the top of the cam profile 214 helps in tilting the UI panel 104.

To improve viewing angle of the UI panel 104 and allow the user to easily operate the UI panel 104, the UI panel 104 in the first position is tilted, by the first actuator 206, as opposed to substantially vertical or substantially horizontal. For instance, the first actuator 206 rotates, for example, by 35-50 degrees, consequently the cam profile 214 moves by the same degree. When the cam profile 214 moves, the tilt support back 220 situated at the top of the cam profile 214 also moves accordingly to tilt the UI panel 104 by a tilt angle 404, as shown in FIG. 4C. The tilt angle 404 is pre-defined by the user. The tilt angle 404 may be, for example, 35-50 degree with respect to the horizontal surface of the multi-function device 102. Alternatively, the UI panel 104 in the first position can be tilted manually by the user. For instance, the user tilts the UI panel 104 in the first position as per the requirement, for example, 35-50 degree with respect to the horizontal surface of the multi-function device 102.

In such a manner, the UI panel 104 is moved out of the multi-function device 102. Thus, the retraction assembly 204 retracts the UI panel 104 into the multi-function device 102, when the retraction assembly 204 is activated, based on the one or more retraction triggering conditions, by the controller 202. Additionally, the retraction assembly 204 moves the retracted UI panel 104 out of the multi-function device 102, when the retraction assembly 204 is activated, based on the one or more protraction triggering conditions, by the controller 202. This way, the UI panel 104 can be moved inside the multi-function device 102 or can be moved outside the multi-function device 102 based on corresponding triggering conditions as discussed above in details. These are few examples to retract the UI panel 104 or move the UI panel 104 outside the multi-function device 102 but retraction or protraction can be performed based on the requirement of an organization, the need of the user or the like. The retraction or protraction can be done based on a manual input from the user, admin user or automatically such as automatic detection of the triggering conditions.

FIGS. 5A-5D show different positions of the UI panel 104 during the retraction of the UI panel 104. Initially, the UI panel 104 in function is in the tilted position or set at a viewing angle as shown in FIG. 5A. At this position/angle, the user can easily access the UI panel 104 and perform any activity. When the present disclosure is implemented, at first, the UI panel 104 is moved from the tilted position to the first position by the first actuator 206, as shown in FIG. 5B. The UI panel 104 in the first position indicates that the UI panel is ready to be retracted inside the multi-function device. Next, the UI panel 104 is moved to the second position as shown FIG. 5C. The second actuator 208 moves the UI panel 104 from the first position to the second position by rotating the UI panel 104 by 90 degree in anticlockwise direction. Then, the UI panel 104 in the second position is retracted into the multi-function device 102. To retract the UI panel 104 into the multi-function device 102, the third actuator 210 rotates in clockwise direction. The pinion 218 and the rack 216 translate the clockwise rotation into the linear motion in the direction 304, because of which the UI panel 104 is retracted into the multi-function device 102, via the opening 228. The UI panel 104 when/after retracted into the multi-function device 102 is shown in the FIG. 5D.

FIGS. 6A-6D show different positions of the UI panel 104 during protraction of the UI panel 104. Initially, the UI panel 104 is inside the multi-function device 102 and not visible to any user from outside, as shown in FIG. 6A. Here, the UI panel 104 is in the retracted position. When the present disclosure is implemented, at first, the UI panel 104 is moved from the retracted position to the second position as shown in FIG. 6B. To move the UI panel 104 from the retracted position to the second position, the third actuator 210 rotates in the anticlockwise direction. The pinion 218 and the rack 216 translate the anticlockwise rotation into the linear motion in the direction 400, because of which the retracted UI panel 104 is moved to the second position, via the opening 228. Next, the UI panel 104 is moved from the second position to the first position as shown in FIG. 6C. The second actuator 208 moves the UI panel 104 from the second position to the first position by rotating the UI panel 104 by 90 degree in the clockwise direction. Then, the first actuator 206 tilts the UI panel 104 based on a pre-defined tilt angle. The UI panel 104 when/after out of the multi-function device 102 is shown in the FIG. 6D.

Exemplary Method Flowcharts

Figure 7:
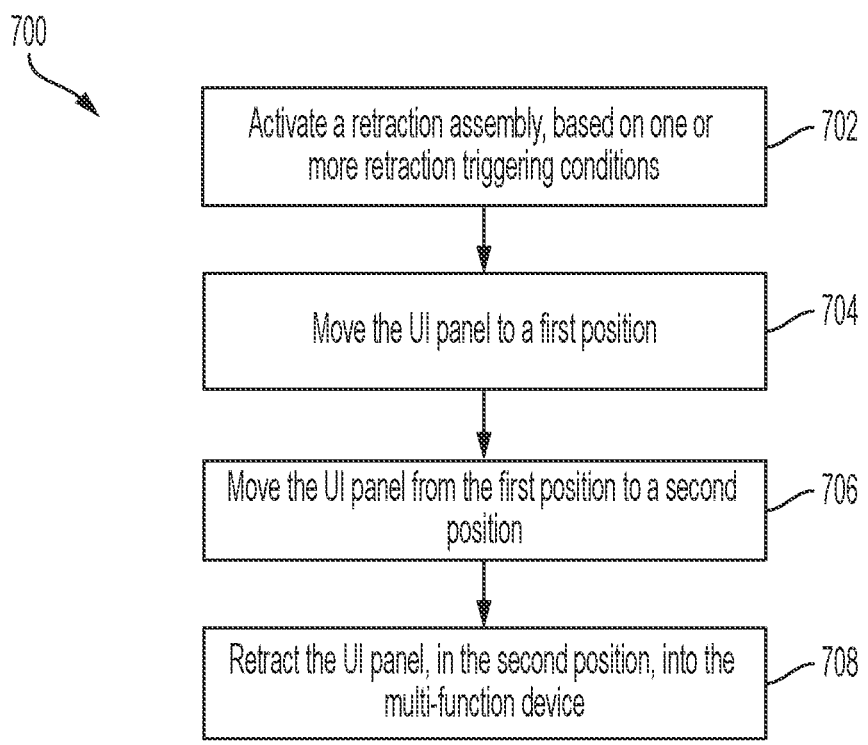
FIG. 7 is a detailed method flowchart for securing the UI panel of the multi-function device, according to an embodiment of the present disclosure.

FIG. 7 is a detailed method flowchart 700 for securing a UI panel such as 104 of a multi-function device such as 102. The method 700 can be implemented at a multi-function device, a printer, a scanner, a copier, or any device with the UI panel 104. The method 700 begins when retraction of the UI panel 104 is to be executed. Initially, at 702, occurrence of at least one triggering condition is determined. Upon determination of the at least one triggering condition, a retraction assembly is activated. Once the retraction assembly 204 is activated, the multiple components of the retraction assembly 204 start functioning.

At 704, the UI panel 104 is moved from a tilted position to a first position by the first actuator 206. The first position refers to a normal position or a non-tilted position of the UI panel 104, e.g., the UI panel 104 with zero tilt angle with respect to the multifunction device 102. Next, at 706, the UI panel 104 is moved from the first position to a second position by the second actuator 208. The second position refers to a position where the UI panel 104 is aligned with the opening 228 such that the UI panel 104 can be retracted into the multi-function device 102 via the opening 228. The second actuator 208 moves the UI panel 104 from the first position to the second position by rotating the UI panel 104 by 90 degree in anticlockwise direction. Then, at 708, the UI panel 104 in the second position is retracted into the multi-function device 102 to secure the UI panel 104 inside the multi-function device 102. To retract the UI panel 104 into the multi-function device 102, the third actuator 210 rotates in clockwise direction. The pinion 218 and the rack 216 translate the clockwise rotation into the linear motion in the direction 304, because of which the UI panel 104 is retracted into the multi-function device 102, via the opening 228.

This way, the method 700 successfully secures the UI panel 104. Further, the retracted UI panel 104 may be moved out of the multi-function device 102.

Figure 8:
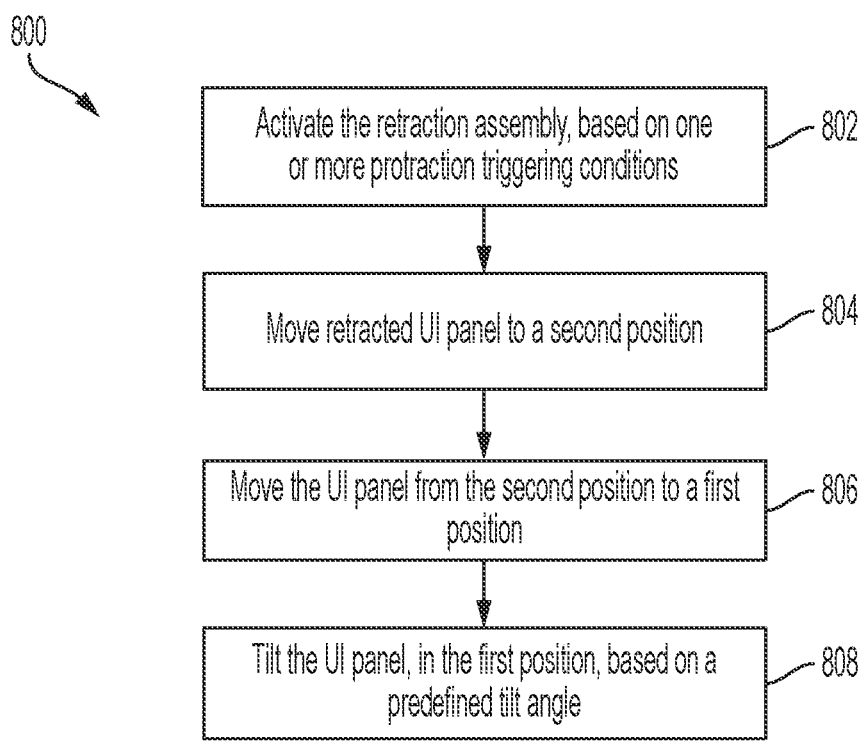
FIG. 8 is a detailed method flowchart for moving retracted UI panel out of the multi-function device, according to an embodiment of the present disclosure.

FIG. 8 is a detailed method flowchart 800 for moving the retracted UI panel 104 out of the multi-function device 102. At 802, the retraction assembly 204 is activated, based on one or more protraction triggering conditions. Once the retraction assembly 204 is activated based on the one or more protraction triggering conditions, the multiple components of the retraction assembly 204 start functioning.

At 804, the retracted UI panel 104 is moved to the second position. To move the retracted UI panel 104 to the second position, the third actuator 210 rotates in anticlockwise direction. The pinion 218 and the rack 216 translate the anticlockwise rotation into the linear motion in the direction 400, because of which the retracted UI panel 104 is moved to the second position, via the opening 228. The second position refers to a position where the UI panel 104 is aligned with the opening 228 such that the UI panel 104 can be retracted into the multi-function device 102 via the opening 228. Next, at 806, the UI panel 104 is moved from the second position to the first position by the second actuator 208. The first position refers to a normal position or a non-tilted position of the UI panel 104, e.g., the UI panel 104 with zero tilt angle with respect to the multifunction device 102. The second actuator 208 moves the UI panel 104 from the second position to the first position by rotating the UI panel 104 by 90 degree in the clockwise direction. Then, at 808, the UI panel 104 in the first position is tilted by the first actuator 206, based on a pre-defined tilt angle. This way, the UI panel 104 is moved out of the multi-function device 102.

The present disclosure discloses methods and systems for retracting and protracting a UI panel of devices such as multi-function devices, scanners, printers, multi-function printers and so on. The methods and systems retract the UI panel into the device to secure the UI panel inside the device. Since the UI panel is secured within the device, the UI panel is not prone to damages during shifting of the device from one location to another location, and other accidental damages. Thereby, safety of the UI panel is improved. The methods and systems provide for automatic and/or manual initiation of the retraction of the UI panel. Therefore, the methods and systems provide an easy and improved way of handling the UI panel. The methods and systems provide comfort to the user.

The present disclosure is discussed with multi-function device as an example, but the disclosure is applicable to any devices having UI panels for use by the users.

The order in which the method is described is not intended to be construed as a limitation, and any number of the described method blocks can be combined in any order to implement the method or alternate methods. Additionally, individual blocks may be deleted from the method without departing from the spirit and scope of the subject matter described herein. Furthermore, the method can be implemented in any suitable hardware, software, firmware, or combination thereof. However, for ease of explanation, in the embodiments described below, the method may be considered to be implemented in the above-described system and/or the apparatus and/or any electronic device (not shown).

The above description does not provide specific details of manufacture or design of the various components. Those of skill in the art are familiar with such details, and unless departures from those techniques are set out, techniques, known, related art or later developed designs and materials should be employed. Those in the art are capable of choosing suitable manufacturing and design details.

Note that throughout the following discussion, numerous references may be made regarding servers, services, engines, modules, interfaces, portals, platforms, or other systems formed from computing devices. It should be appreciated that the use of such terms is deemed to represent one or more computing devices having at least one processor configured to or programmed to execute software instructions stored on a computer readable tangible, non-transitory medium or also referred to as a processor-readable medium. For example, a server can include one or more computers operating as a web server, database server, or other type of computer server in a manner to fulfill described roles, responsibilities, or functions. Within the context of this document, the disclosed devices or systems are also deemed to comprise computing devices having a processor and a non-transitory memory storing instructions executable by the processor that cause the device to control, manage, or otherwise manipulate the features of the devices or systems.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "securing" or "activating" or "retracting" or "moving" or "sending" "or transmitting" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The terminology used herein is for the purpose of describing particular embodiments only and is not intended to be limiting of the disclosure. It will be appreciated that several of the above-disclosed and other features and functions, or alternatives thereof, may be combined into other systems or applications. Various presently unforeseen or unanticipated alternatives, modifications, variations, or improvements therein may subsequently be made by those skilled in the art without departing from the scope of the present disclosure as encompassed by the following claims.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A multi-function device comprising:
a user interface (UI) panel for allowing one or more users to provide one or more inputs and display one or more messages to the one or more users, wherein the UI panel is tilted;
a controller comprising hardware for managing a retraction assembly associated with the multi-function device, based on one or more triggering conditions; and
the retraction assembly communicatively coupled to the controller, upon activation, the retraction assembly retracts the UI panel into the multi-function device to secure the UI panel inside the multi-function device.

2. The multi-function device of claim 1, wherein the retraction assembly is activated based on the one or more triggering conditions.

3. The multi-function device of claim 1, wherein the retraction assembly comprises a first actuator for moving the UI panel to a first position.

4. The multi-function device of claim 3, wherein the retraction assembly further comprises a second actuator for moving the UI panel from the first position to a second position.

5. The multi-function device of claim 4, wherein the retraction assembly further comprises a third actuator for retracting the UI panel, in the second position, into the multi-function device.

6. The multi-function device of claim 1, wherein the retraction assembly further comprises at least one guide rail for guiding a movement of the UI panel while retracting the UI panel into multi-function device.

7. The multi-function device of claim 1, wherein the retraction assembly is for moving the retracted UI panel outside the multi-function device for use by the one or more users.

8. The multi-function device of claim 7, wherein the retraction assembly for moving the retracted UI panel outside the multi-function device, comprises a third actuator for moving the retracted UI panel to a second position.

9. The multi-function device of claim 8, wherein the retraction assembly further comprises a second actuator for moving the UI panel from the second position to a first position.

10. The multi-function device of claim 9, wherein the retraction assembly further comprises a first actuator for tilting the UI panel in the first position.

11. The multi-function device of claim 10, wherein the UI panel in the first position is tiltable.

12. The multi-function device of claim 8, wherein the retraction assembly further comprises at least one guide rail for guiding a movement of the UI panel while moving the retracted UI panel to the second position.

13. The multi-function device of claim 1, wherein the retraction assembly is activated, to retract the UI panel into the multi-function device when at least one triggering condition occurs: when the multi-function device is not in use, when the multi-function device is turned off, when the UI panel is not in use, when no user is present in proximity to the multi-function device, when the multi-function device is moved from one location to another location, when a request to retract the UI panel is received from a user or from an admin user.

14. The multi-function device of claim 1, wherein the retraction assembly is activated, to move the retracted UI panel out of the multi-function device when at least one triggering condition occurs: when the multi-function device is turned on, when a user wants to use the multi-function device or the UI panel of the multi-function device, or when a user is present in proximity to the multi-function device.

15. The multi-function device of claim 13 or 14, further comprising a detector for determining if the user is present in proximity to the multi-function device.

16. The multi-function device of claim 1, wherein the hardware comprises discrete components, an integrated circuit, an application-specific integrated circuit (ASIC), a field programmable gate array (FPGA), or a processor.

17. The multi-function device of claim 1, wherein the hardware comprises a processor and software that is executable by the processor.

18. The multi-function device of claim 1, wherein the retraction assembly retracts the UI panel into the multi-function device by:
   aligning the UI panel with an opening of the multi-function device; and
   linearly retracting the UI panel into the opening of the multi-function device.

19. The multi-function device of claim 18, wherein aligning the UI panel with the opening of the multi-function device comprises rotating the UI panel by 90 degrees.

20. The multi-function device of claim 1, wherein:
   the retraction assembly comprises a first actuator configured to produce motion of one or more components of the retraction assembly; and
   the retraction assembly retracts the UI panel into the multi-function device using at least the first actuator.

21. The multi-function device of claim 20, wherein the first actuator comprises a solenoid or an electric motor.

22. The multi-function device of claim 1, wherein the multi-function device comprises a scanner, a copier, and/or a multi-function printer.

23. The multi-function device of claim 1, wherein, upon activation, the retraction assembly retracts the UI panel into the multi-function device to a retracted position completely inside the multi-function device.

24. A method securing a user interface (UI) panel of a multi-function device, the method comprising:
   Activating, by a controller comprising hardware, a retraction assembly, based on one or more triggering conditions; and
   based on the activation, performing at least:
      retracting the UI panel into the multi-function device to secure the UI panel inside the multi-function device; and
      moving the retracted UI panel outside the multi-function device for use by one or more users.

25. The method of claim 24, wherein retracting the UI panel into the multi-function device further comprises:
   moving the UI panel to a first position;
   moving the UI panel from the first position to a second position; and
   retracting the UI panel, in the second position, into the multi-function device.

26. The method of claim 24, further comprising, guiding a movement of the UI panel while retracting the UI panel into multi-function device.

27. The method of claim 24, wherein the one or more triggering conditions comprise at least: when the multi-function device is not in use, when the multi-function device is turned off, when the UI panel is not in use, when no user is present in proximity to the multi-function device, when the multi-function device is moved from one location to another location, when a request to retract the UI panel is received from a user or from an admin user, when the multi-function device is turned on, when a user wants to use the multi-function device or the UI panel of the multi-function device, or when a user is present in proximity to the multi-function device.

28. The method of claim 24, wherein moving the retracted UI panel outside the multi-function device further comprises:
   moving the retracted UI panel to a second position;
   moving the UI panel from the second position to a first position; and
   tilting the UI panel in the first position.

* * * * *